(12) United States Patent
Li et al.

(10) Patent No.: US 11,858,244 B2
(45) Date of Patent: Jan. 2, 2024

(54) LAMINATING DEVICE, LAMINATING METHOD THEREOF, FLEXIBLE DISPLAY MODULE AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Fei Li, Beijing (CN); Wei Liu, Beijing (CN); Binfeng Feng, Beijing (CN); Zhihao Xie, Beijing (CN); Bowen Xiao, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 255 days.

(21) Appl. No.: 17/417,151

(22) PCT Filed: Sep. 15, 2020

(86) PCT No.: PCT/CN2020/115427
§ 371 (c)(1),
(2) Date: Jun. 22, 2021

(87) PCT Pub. No.: WO2022/056694
PCT Pub. Date: Mar. 24, 2022

(65) Prior Publication Data
US 2022/0324218 A1    Oct. 13, 2022

(51) Int. Cl.
| | | |
|---|---|---|
| B32B 37/10 | (2006.01) |
| B32B 7/022 | (2019.01) |
| B32B 37/00 | (2006.01) |
| B32B 7/12 | (2006.01) |
| G06F 1/16 | (2006.01) |

(52) U.S. Cl.
CPC .......... *B32B 37/1045* (2013.01); *B32B 7/022* (2019.01); *B32B 37/0053* (2013.01);
(Continued)

(58) Field of Classification Search
CPC . B32B 37/1045; B32B 7/022; B32B 37/0053; B32B 37/1018; B32B 7/12;
(Continued)

(56) References Cited

U.S. PATENT DOCUMENTS

| 4,589,942 A | 5/1986 | Korinek |
| 2012/0020056 A1 | 1/2012 | Yamagata et al. |

(Continued)

FOREIGN PATENT DOCUMENTS

| CN | 104779266 A | 7/2015 |
| CN | 106796913 A | 5/2017 |

(Continued)

*Primary Examiner* — Christopher W Raimund
(74) *Attorney, Agent, or Firm* — ArentFox Schiff LLP; Michael Fainberg

(57) ABSTRACT

The disclosure provides a laminating device, a laminating method thereof, a flexible display module and a display device. The laminating device is configured to laminate layers of the flexible display module. The laminating device includes a stress applying component, configured to control the first laminating base platform and the second laminating base platform to laminate in a lamination direction, and control at least one of the first laminating base platform and the second laminating base platform to be deformed in a direction perpendicular to the lamination direction during lamination, such that the first laminate layer, that has been laminated, in an unfolded state is provided with a pre-applied stress, wherein a direction of the pre-applied stress is opposite to a direction of a stress borne by the first laminate layer in a folded state.

14 Claims, 10 Drawing Sheets

(52) U.S. Cl.
CPC ............ *B32B 37/1018* (2013.01); *B32B 7/12* (2013.01); *B32B 2250/02* (2013.01); *B32B 2307/51* (2013.01); *B32B 2457/20* (2013.01); *G06F 1/1652* (2013.01)

(58) Field of Classification Search
CPC ............ B32B 2250/02; B32B 2307/51; B32B 2457/20; B32B 2307/54; B32B 37/144; G06F 1/1652; G09F 9/30; H01L 21/683
See application file for complete search history.

(56) References Cited

U.S. PATENT DOCUMENTS

| | | |
|---|---|---|
| 2014/0045283 A1 | 2/2014 | Hirakata et al. |
| 2015/0200375 A1 | 7/2015 | Kim et al. |
| 2017/0199547 A1 | 7/2017 | Jeong et al. |
| 2017/0210062 A1 | 7/2017 | Chen et al. |
| 2021/0229372 A1 | 7/2021 | Ding et al. |

FOREIGN PATENT DOCUMENTS

| | | | | |
|---|---|---|---|---|
| CN | 106960634 A | 7/2017 | | |
| CN | 107015675 A | 8/2017 | | |
| CN | 107160809 A | 9/2017 | | |
| CN | 107908308 A | 4/2018 | | |
| CN | 109949702 A | 6/2019 | | |
| JP | 2002341323 A | 11/2002 | | |
| JP | 2003022029 A | 1/2003 | | |
| JP | 2005305999 A | 11/2005 | | |
| KR | 2019108794 A | * 9/2019 | ......... | G02F 1/13338 |

* cited by examiner

LAMINATING DEVICE, LAMINATING METHOD THEREOF, FLEXIBLE DISPLAY MODULE AND DISPLAY DEVICE

The present disclosure is a National Stage of International Application No. PCT/CN2020/115427, filed on Sep. 15, 2020, the content of which is incorporated herein by reference in its entirety.

FIELD

The present disclosure relates to the field of display technology, in particular to a laminating device, a laminating method thereof, a flexible display module and a display device.

BACKGROUND

With scientific development and technical progress, people's demands and dependency on electronic equipment (such as a mobile phone and a tablet computer) increase day by day, and functions of the electronic equipment are more and more diversified. Depending on the flexibility of a flexible display screen, a foldable display terminal can be folded or unfolded by a user, which has become a development tendency of the electronic equipment. Specifically, when in a folded state, the foldable display terminal is relatively small so as to be portable; and when in an unfolded state, the foldable display terminal is relatively large in display area so as to achieve a better visual effect.

SUMMARY

In one aspect, embodiments of the present disclosure provide a laminating device, configured to laminate layers of a flexible display module. The laminating device includes:
a first laminating base platform, provided with a tension stress and configured to bear a first laminate layer of the flexible display module;
a second laminating base platform, opposite to the first laminating base platform, wherein the second laminating base platform is provided with a tension stress, and a surface, facing the first laminating base platform, of the second laminating base platform is configured to bear a second laminate layer of the flexible display module; and
a stress applying component, configured to control the first laminating base platform and the second laminating base platform to laminate in a lamination direction, and control at least one of the first laminating base platform and the second laminating base platform to be deformed in a direction perpendicular to the lamination direction during lamination, such that the first laminate layer, that has been laminated, in an unfolded state is provided with a pre-applied stress, wherein a direction of the pre-applied stress is opposite to a direction of a stress borne by the first laminate layer in a folded state.

Optionally, in the above-mentioned laminating device provided in the embodiments of the present disclosure, an elastic modulus of the second laminate layer is greater than an elastic modulus of the first laminate layer.

Optionally, in the above-mentioned laminating device provided in the embodiments of the present disclosure, the first laminating base platform and the second laminating base platform are made of a non-woven fabric.

Optionally, in the above-mentioned laminating device provided in the embodiments of the present disclosure, the stress applying component includes: a first roller, a second roller, a first cylinder, a second cylinder, a first servo motor, a second servo motor, a first driving track and a second driving track, wherein
the first roller is in contact with a surface, away from the first laminate layer, of the first laminating base platform, and the first roller is fixed to the first cylinder;
the first servo motor is configured to drive the first cylinder to move on the first driving track in the lamination direction, and provide power, in the direction perpendicular to the lamination direction, for the first cylinder;
the second roller is in contact with a surface, away from the second laminate layer, of the second laminating base platform, and the second roller is fixed to the second cylinder; and
the second servo motor is configured to drive the second cylinder to synchronously move with the first cylinder on the second driving track in the lamination direction, and provide power, in the direction perpendicular to the lamination direction, for the second cylinder.

Optionally, in the above-mentioned laminating device provided in the embodiments of the present disclosure, the first cylinder controls a stroke of the first roller in the direction perpendicular to the lamination direction to be equal to $\frac{1}{2}$ of a distance from the first laminating base platform to the second laminating base platform; and
the second cylinder controls a stroke of the second roller in the direction perpendicular to the lamination direction to be equal to $\frac{1}{2}$ of the distance from the first laminating base platform to the second laminating base platform.

Optionally, in the above-mentioned laminating device provided in the embodiments of the present disclosure, the first cylinder controls a stroke of the first roller in the direction perpendicular to the lamination direction to be zero; and the second cylinder controls a stroke of the second roller in the direction perpendicular to the lamination direction to be equal to a distance from the first laminating base platform to the second laminating base platform.

Optionally, in the above-mentioned laminating device provided in the embodiments of the present disclosure, the first cylinder controls a stroke of the first roller in the direction perpendicular to the lamination direction to be equal to a distance from the first laminating base platform to the second laminating base platform; and the second cylinder controls a stroke of the second roller in the direction perpendicular to the lamination direction to be zero.

Optionally, the above-mentioned laminating device provided in the embodiments of the present disclosure further includes: a first vacuum chamber and a second vacuum chamber which are oppositely disposed, wherein
the first laminating base platform and the first driving track are fixed inside the first vacuum chamber, and a side, facing the second vacuum chamber, of the first vacuum chamber is provided with a first opening to expose a surface, bearing the first laminate layer, of the first laminating base platform; and
the second laminating base platform and the second driving track are fixed inside the second vacuum chamber, and a side, facing the first vacuum chamber, of the second vacuum chamber is provided with a second opening to expose a surface, bearing the second laminate layer, of the second laminating base platform.

Optionally, the above-mentioned laminating device provided in the embodiments of the present disclosure further includes: a first sealing strip and a second sealing strip, wherein the first sealing strip is fixedly connected with a peripheral region of the first laminating base platform and with the first vacuum chamber around the first opening; and the second sealing strip is fixedly connected with a peripheral region of the second laminating base platform and with the second vacuum chamber around the second opening.

In another aspect, embodiments of the present disclosure provide a laminating method of the above-mentioned laminating device, including:

placing a first laminate layer of a flexible display module on a first laminating base platform with a tension stress, and placing a second laminate layer of the flexible display module on a second laminating base platform with a tension stress; and controlling, by a stress applying component, the first laminating base platform and the second laminating base platform to laminate in a lamination direction, and controlling, by the stress applying component, at least one of the first laminating base platform and the second laminating base platform to be deformed in a direction perpendicular to the lamination direction during lamination, such that the first laminate layer, that has been laminated, in an unfolded state is provided with a pre-applied stress, wherein a direction of the pre-applied stress is opposite to a direction of a stress borne by the first laminate layer in a folded state.

Optionally, in the above-mentioned laminating method provided in the embodiments of the present disclosure, the placing the first laminate layer of the flexible display module on the first laminating base platform with a tension stress, and the placing the second laminate layer of the flexible display module on the second laminating base platform with the tension stress includes:

vacuum-adsorbing the first laminate layer of the flexible display module on the first laminating base platform with the tension stress, and vacuum-adsorbing the second laminate layer of the flexible display module on the second laminating base platform with the tension stress, wherein an elastic modulus of the second laminate layer is greater than an elastic modulus of the first laminate layer.

Optionally, in the above-mentioned laminating method provided in the embodiments of the present disclosure, the controlling, by the stress applying component, the first laminating base platform and the second laminating base platform to laminate in the lamination direction, and the controlling, by the stress applying component, at least one of the first laminating base platform and the second laminating base platform to be deformed in the direction perpendicular to the lamination direction during lamination includes:

driving, by a first servo motor and a second servo motor, a first cylinder and a second cylinder to synchronously move in the lamination direction, respectively, and controlling the first cylinder and the second cylinder to move towards each other in the direction perpendicular to the lamination direction for ½ of a distance from the first laminating base platform to the second laminating base platform, respectively, such that the pre-applied stress of the first laminate layer, that has been laminated, in the unfolded state is zero.

Optionally, in the above-mentioned laminating method provided in the embodiments of the present disclosure, the controlling, by the stress applying component, the first laminating base platform and the second laminating base platform to laminate in the lamination direction, and the controlling, by the stress applying component, at least one of the first laminating base platform and the second laminating base platform to be deformed in the direction perpendicular to the lamination direction during lamination includes:

driving, by a first servo motor and a second servo motor, a first cylinder and a second cylinder to synchronously move in the lamination direction, respectively, controlling the first cylinder to move in the direction perpendicular to the lamination direction until the first laminate layer is in contact with the second laminate layer, and controlling the second cylinder not to move in the direction perpendicular to the lamination direction, such that the first laminate layer, that has been laminated, in the unfolded state is provided with a pre-tension stress.

Optionally, in the above-mentioned laminating method provided in the embodiments of the present disclosure, the controlling, by the stress applying component, the first laminating base platform and the second laminating base platform to laminate in the lamination direction, and the controlling, by the stress applying component, at least one of the first laminating base platform and the second laminating base platform to be deformed in the direction perpendicular to the lamination direction during lamination includes:

driving, by a first servo motor and a second servo motor, a first cylinder and a second cylinder to synchronously move in the lamination direction, respectively, controlling the first cylinder not to move in the direction perpendicular to the lamination direction, and controlling the second cylinder to move in the direction perpendicular to the lamination direction until the first laminate layer is in contact with the second laminate layer, such that the first laminate layer, that has been laminated, in the unfolded state is provided with a pre-compressive stress.

In a further aspect, embodiments of the present disclosure further provide a flexible display module, including a plurality of laminate layers, wherein the laminate layers are laminated with each other by the above-mentioned laminating device.

Optionally, in the above-mentioned flexible display module provided in the embodiments of the present disclosure, the first laminate layer is a flexible display substrate, and the second laminate layer is a supporting plate or a protective cover plate.

Optionally, in the above-mentioned flexible display module provided in the embodiments of the present disclosure, each of the laminate layers includes a first folding part, a second folding part and a flat part connecting the first folding part with the second folding part, wherein a bending direction of the first folding part is opposite to a bending direction of the second folding part, and a pre-applied stress direction of the first folding part is opposite to a pre-applied stress direction of the second folding part.

Optionally, in the above-mentioned flexible display module provided in the embodiments of the present disclosure, a pre-applied stress of the first folding part is equal to ½ of a stress borne by the first folding part in a completely folded state; and a pre-applied stress of the second folding part is equal to ½ of a stress borne by the second folding part in a completely folded state.

Optionally, in the above-mentioned flexible display module provided in the embodiments of the present disclosure, a pre-applied stress of the flat part is zero.

In a further aspect, an embodiment of the present disclosure provides a display device, including the above-mentioned flexible display module.

DETAILED DESCRIPTION OF THE EMBODIMENTS

In order to make objectives, technical solutions and advantages of the embodiments of the present disclosure clearer, the technical solutions in the embodiments of the present disclosure will be described clearly and completely below in conjunction with the accompanying drawings in the embodiments of the present disclosure. It should be noted that the sizes and shapes of all patterns in the accompanying drawings do not reflect real scales, and are merely to illustrate the contents of the present disclosure. Furthermore, same or similar numerals throughout indicate same or similar elements or elements with same or similar functions. Obviously, the described embodiments are a part of the embodiments of the present disclosure, not all the embodiments. Based on the described embodiments of the present disclosure, all other embodiments obtained by those of ordinary skill in the art without creative work shall fall within the protection scope of the present disclosure.

Unless otherwise defined, technical terms or scientific terms used herein shall have ordinary meanings as understood by those of ordinary skill in the art to which the present disclosure belongs. The words "first", "second" and similar words used in the specification and claims of the present disclosure do not denote any order, quantity or importance, but are merely used to distinguish different components. The word "including" or "includes" or the like means that the element or item preceding the word covers the element or object listed after the word and its equivalent, without excluding other elements or objects. "Inner", "outer", "upper", "lower" and the like are only used to denote relative position relations. When an absolute position of a described object changes, the relative position relationship may also change accordingly.

Figure 1:
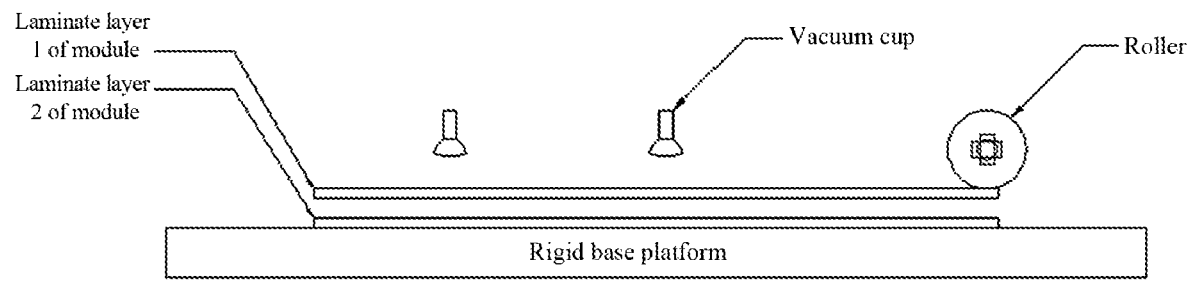
FIG. 1 is a schematic diagram showing a structure of a laminating device in the related art.
Figure 2:
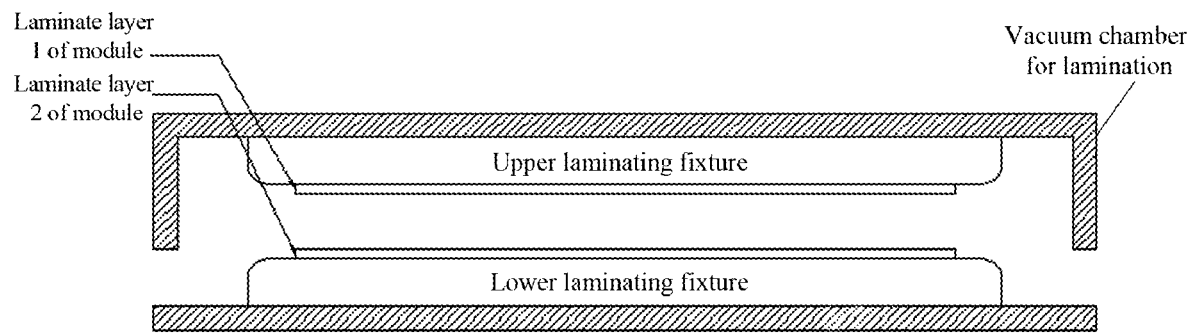
FIG. 2 is a schematic diagram showing another structure of a laminating device in the related art.

For a flexible foldable and curly display product, laminate layers of a flexible display product are generally laminated by adopting a single-roller laminating solution shown in FIG. 1 and a vacuum chamber laminating solution shown in FIG. 2. In a process of laminating realized by adopting above two laminating solutions, the laminate layers are relatively uniformly stressed, so that the laminate layers in an unfolded state are in an initial state, that is, there are no inward tension/compressive stresses inside the laminate layers. However, in a folded state, the laminate layers may be subjected to greater inward tension/compressive stresses. For a long time, repeated mechanical folding on materials of the laminate layers may result in failure of product performances.

Figure 3:
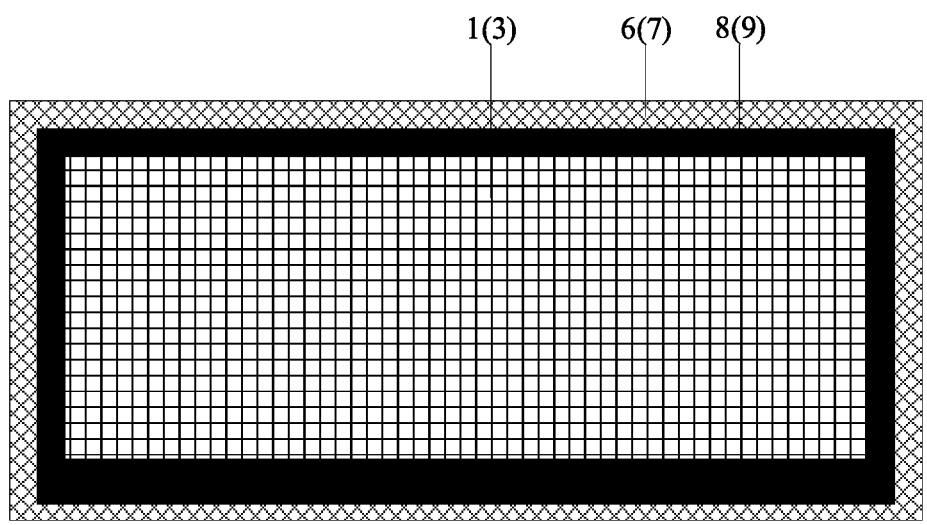
FIG. 3 is a schematic diagram showing a structure of a laminating device provided in an embodiment of the present disclosure.
Figure 4:
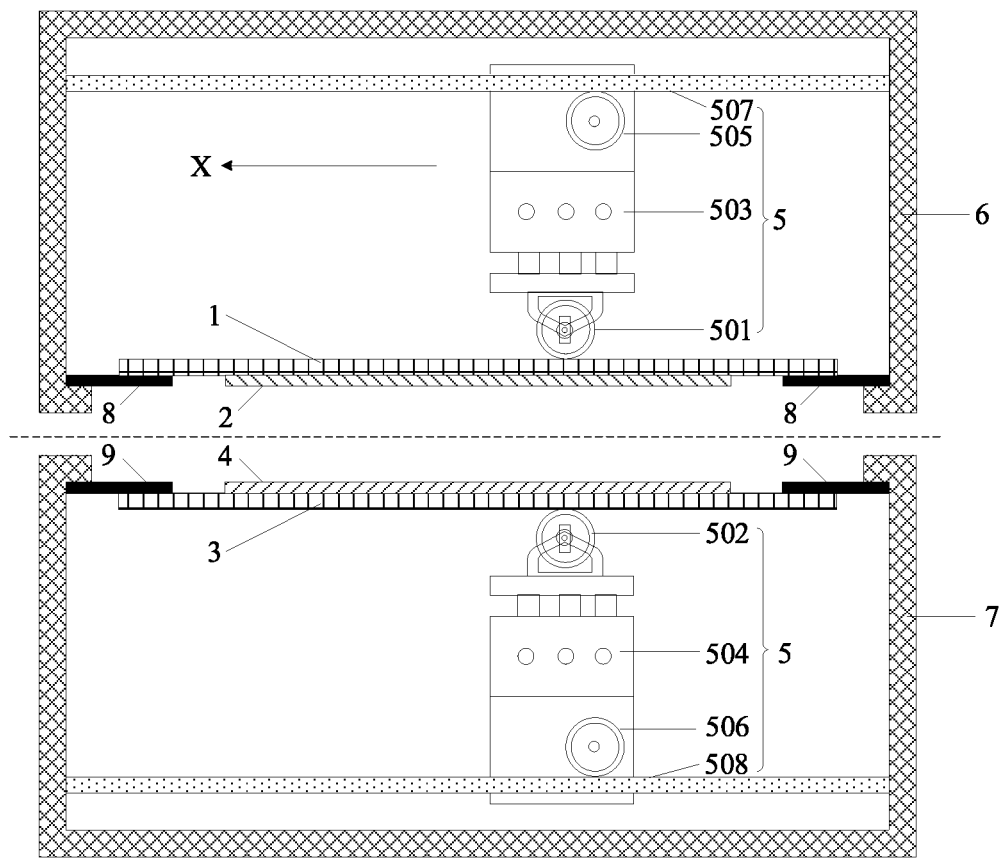
FIG. 4 is a schematic diagram showing another structure of a laminating device provided in an embodiment of the present disclosure.
Figure 5:
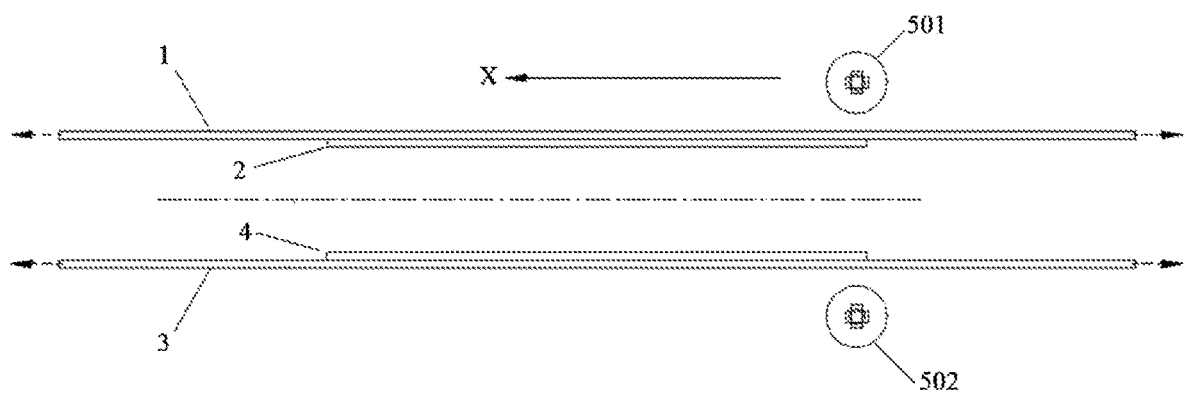
FIG. 5 is a schematic diagram showing that laminate layers are not laminated by a laminating device provided in an embodiment of the present disclosure.

For the above-mentioned problems existing in the related art, embodiments of the present disclosure provide a laminating device configured to laminate layers of a flexible display module. As shown in FIG. 3 to FIG. 5, the laminating device includes:

a first laminating base platform 1, provided with a tension stress and configured to bear a first laminate layer 2 of the flexible display module;

a second laminating base platform 3, opposite to the first laminating base platform 1, wherein the second laminating base platform 3 is provided with a tension stress, and a surface, facing the first laminating base platform 1, of the second laminating base platform 3 is configured to bear a second laminate layer 4 of the flexible display module; and a stress applying component 5, configured to control the first laminating base platform 1 and the second laminating base platform 3 to laminate in a lamination direction X, and control at least one of the first laminating base platform 1 and the second laminating base platform 3 to be deformed in a direction perpendicular to the lamination direction during lamination, such that the first laminate layer 2, that has been laminated, in an unfolded state is provided with a pre-applied stress, wherein a direction of the pre-applied stress is opposite to a direction of a stress borne by the first laminate layer 2 in a folded state.

By adopting the above-mentioned laminating device provided in the embodiments of the present disclosure, the purpose of applying a pre-applied stress to the first laminate layer 2 in the unfolded state is achieved. Moreover, since the direction of the pre-applied stress is opposite to the direction of the stress borne by the first laminate layer 2 in the folded state, after the first laminate layer 2 is folded, the pre-applied stress is capable of partially or completely neutralizing a stress borne by folding, that is, the stress borne by the first laminate layer 2 in the folded state is reduced, furthermore, the risk of fatigue failure caused by folding the first laminate layer 2 is reduced, and the service life is prolonged. When the first laminate layer 2 represents a different laminate layer, the pre-applied stress situations of the different laminate layers may be respectively adjusted by repeatedly using the laminating device, thereby improving the overall mechanical failure resistance of a foldable display product.

Optionally, in the above-mentioned laminating device provided in the embodiments of the present disclosure, the elastic modulus of the second laminate layer 4 is greater than the elastic modulus of the first laminate layer 2, which facilitates applying a stress to the first laminate layer 2 by the second laminate layer 4 in a process of restoring to the unfolded state after lamination, such that the first laminate layer 2 is provided with the pre-applied stress in the unfolded state.

Optionally, in the above-mentioned laminating device provided in the embodiments of the present disclosure, the first laminating base platform 1 and the second laminating base platform 3 are made of a non-woven fabric. The non-woven fabric has good breathability and flexibility and is capable of fixing the first laminate layer 2 or the second laminate layer 4 in a vacuum adsorption way.

Optionally, in the above-mentioned laminating device provided in the embodiments of the present disclosure, as shown in FIG. 4, the stress applying component 5 may include: a first roller 501, a second roller 502, a first cylinder 503, a second cylinder 504, a first servo motor 505, a second servo motor 506, a first driving track 507 and a second driving track 508; wherein the first roller 501 is in contact with the surface, away from the first laminate layer 2, of the first laminating base platform 1, and the first roller 501 is fixed to the first cylinder 503; the first servo motor 505 is configured to drive the first cylinder 503 to move on the first driving track 507 in the lamination direction, and provide power, in the direction perpendicular to the lamination direction, for the first cylinder 503; and when moving back and forth in the direction perpendicular to the lamination direction, the first cylinder 503 may drive the first roller 501 and the first laminating base platform 1 bearing the first laminate layer 2 to synchronously move in the direction perpendicular to the lamination direction, such that the first laminating base platform 1 is deformed in the direction perpendicular to the lamination direction.

The second roller 502 is in contact with the surface, away from the second laminate layer 4, of the second laminating base platform 3, and the second roller 502 is fixed to the second cylinder 504; the second servo motor 506 is configured to drive the second cylinder 504 to synchronously move with the first cylinder 503 on the second driving track 508 in the lamination direction, and provide power, in the direction perpendicular to the lamination direction, for the second cylinder 504; and when moving back and forth in the direction perpendicular to the lamination direction, the second cylinder 504 may drive the second roller 502 and the second laminating base platform 3 bearing the second laminate layer 4 to synchronously move in the direction perpendicular to the lamination direction, such that the second laminating base platform 3 is deformed in the direction perpendicular to the lamination direction.

Figure 6:
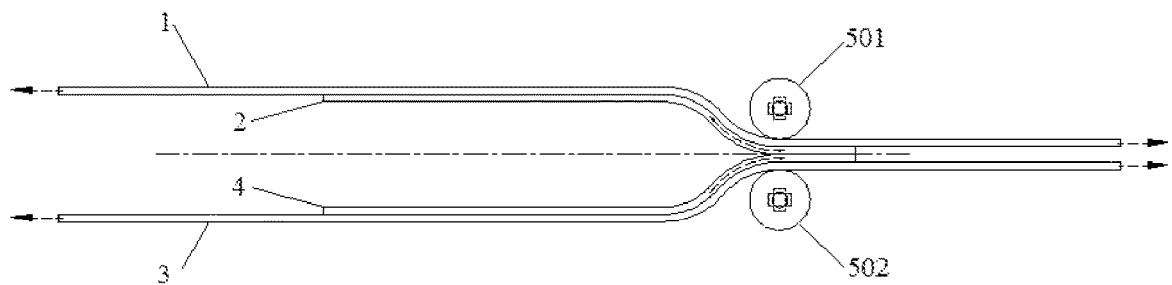
FIG. 6 is a schematic diagram showing a process for laminating laminate layers performed by a laminating device provided in an embodiment of the present disclosure.

Optionally, in the above-mentioned laminating device provided in the embodiments of the present disclosure, the first cylinder 503 controls a stroke of the first roller 501 in the direction perpendicular to the lamination direction to be equal to ½ of a distance from the first laminating base platform 1 to the second laminating base platform 3, and the second cylinder 504 controls a stroke of the second roller 502 in the direction perpendicular to the lamination direction to be equal to ½ of a distance from the first laminating base platform 1 to the second laminating base platform 3, that is, the relative movement distances of the first roller 501 and the second roller 502 in the direction perpendicular to the lamination direction are the same, as shown in FIG. 6. In this case, the first laminating base platform 1 and the second laminating base platform 3 have the same deformation, such that a tension stress applied to the first laminate layer 2 by the first laminating base platform 1 is the same as a tension stress applied to the second laminate layer 4 by the second laminating base platform 3. Since the elastic modulus of the second laminate layer 4 is greater than the elastic modulus of the first laminate layer 2, after the tension stresses applied by the first laminating base platform 1 and the second laminating base platform 3 are withdrawn, the second laminate layer 4 may apply a compressive stress to the first laminate layer 2, such that the second laminate layer 4 itself is restored to an unstressed state. Meanwhile, the tension stress applied to the first laminate layer 2 by the first laminating base platform 1 may be neutralized by the compressive stress from the second laminate layer 4, and thus, the first laminate layer 2 is also restored to an unstressed state. In other words, in the above-mentioned overall process, the first laminate layer 2 and the second laminate layer 4 are both in the unstressed state after the lamination is completed. The process is suitable for laminating flat parts in the foldable display product, and the flat parts are unstressed in both an unfolded state and a folded state.

Generally, there may be folding parts in addition to the flat parts in the foldable display product. Specifically, in a folded state, the folding parts may bear a compressive stress or a tension stress. In addition, the foldable display product may be provided with one or more folding parts. In a folded state, there may be folding parts bearing the compressive stress and folding parts bearing the tension stress among the plurality of folding parts. Therefore, the folding parts bearing different stresses need to be laminated respectively.

Figure 7:
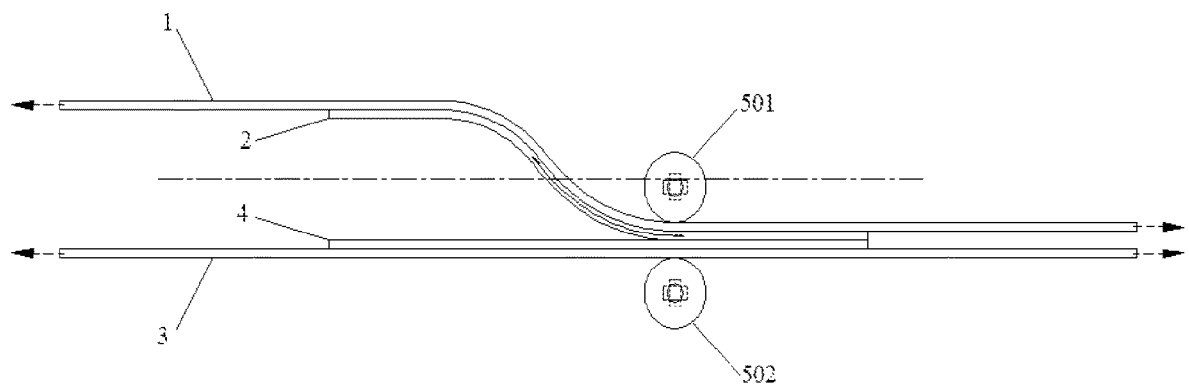
FIG. 7 is another schematic diagram showing a process for laminating laminate layers performed by a laminating device provided in an embodiment of the present disclosure.

Specifically, for the folding parts bearing the compressive stress when in the folded state, as shown in FIG. 7, the first cylinder 503 can control a stroke of the first roller 501 in the direction perpendicular to the lamination direction to be equal to a distance from the first laminating base platform 1 to the second laminating base platform 3, and the second cylinder 504 can control a stroke of the second roller 502 in the direction perpendicular to the lamination direction to be zero. That is, the first roller 501 drives the first laminating base platform 1 to move in the direction perpendicular to the lamination direction to be in contact with the second laminating base platform 3, while the second laminating base platform 3 does not move in the direction perpendicular to the lamination direction. In this case, the first laminating base platform 1 is deformed, and therefore, the first laminating base platform 1 may apply a tension stress to the first laminate layer 2; while the second laminating base platform 3 is not deformed, and therefore, the second laminating base platform 3 does not apply a stress to the second laminate layer 4. In addition, since the elastic modulus of the second laminate layer 4 is greater than the elastic modulus of the first laminate layer 2, after the tension stress applied to the first laminate layer 2 by the first laminating base platform 1 is withdrawn, the first laminate layer 2 may still be kept with the tension stress inside and is hardly restored to an unstressed state. By the process, a pre-tension stress may be applied to a folding part in an unfolded state, and when the pre-tension stress is kept until a folding operation starts, a compressive stress borne by folding may be neutralized, thereby improving the bending resistance of the product, and reducing the risk of fatigue failure.

Figure 8:
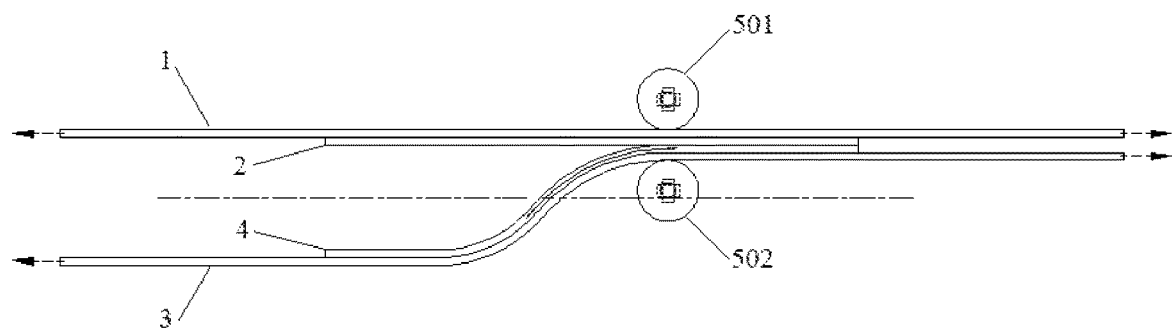
FIG. 8 is a further schematic diagram showing a process for laminating laminate layers performed by a laminating device provided in an embodiment of the present disclosure.

In addition, for the folding parts bearing the tension stress in the folded state, as shown in FIG. 8, the first cylinder 503 can control a stroke of the first roller 501 in the direction perpendicular to the lamination direction to be zero, and the second cylinder 504 can control the second roller 502 in the direction perpendicular to the lamination direction to be equal to a distance from the first laminating base platform 1 to the second laminating base platform 3. That is, the second roller 502 drives the second laminating base platform 3 to move in the direction perpendicular to the lamination direction to be in contact with the first laminating base platform 1, while the first laminating base platform 1 does not move in the direction perpendicular to the lamination direction. In this case, the second laminating base platform 3 is deformed, and therefore, the second laminating base platform 3 may apply a tension stress to the second laminate layer 4; while the first laminating base platform 1 is not be deformed, and therefore, the first laminating base platform 1 does not apply a stress to the first laminate layer 2. In addition, since the elastic modulus of the second laminate layer 4 is greater than the elastic modulus of the first laminate layer 2, after the tension stress applied to the second laminate layer 4 by the second laminating base platform 3 is withdrawn, the second laminate layer 4 is easily restored to an unstressed state, a compressive stress may be applied to the first laminate layer 2 in the process that the second laminate layer 4 is restored to the unstressed state, and therefore, after the lamination is completed, the first laminate layer 2 is provided with a pre-compressive stress, while the second laminate layer 4 is provided with no stress inside. In the case that a folding part in an unfolded state is provided with a pre-compressive stress, when the pre-compressive stress is kept until a folding operation starts, a tension stress borne by folding may be neutralized, thereby improving the bending resistance of the product, and reducing the risk of fatigue failure.

Optionally, in order to realize vacuum adsorption of the laminating base platforms to the laminate layers, as shown in FIG. 4, the above-mentioned laminating device provided in the embodiments of the present disclosure may further include: a first vacuum chamber 6 and a second vacuum chamber 7 which are oppositely disposed; wherein the first laminating base platform 1 and the first driving track 507 are fixed inside the first vacuum chamber 6, the side, facing the second vacuum chamber 7, of the first vacuum chamber 6 is provided with a first opening to expose the surface, bearing the first laminate layer 2, of the first laminating base platform 1, and at this point, the first roller 501, the first cylinder 503 and the first servo motor 505 are also located in the first vacuum chamber 6; and the second laminating base platform 3 and the second driving track 508 are fixed inside the second vacuum chamber 7, the side, facing the first vacuum chamber 6, of the second vacuum chamber 7 is provided with a second opening to expose the surface, bearing the second laminate layer 4, of the second laminating base platform 3, and at this point, the second roller 502, the second cylinder 504 and the second servo motor 506 are also located in the second vacuum chamber 7.

Optionally, in order to make the first laminating base platform 1 and the second laminating base platform 3 themselves have tension stresses, the above-mentioned laminating device provided in the embodiments of the present disclosure, as shown in FIG. 3 and FIG. 4, may further include: a first sealing strip 8 and a second sealing strip 9; wherein the first sealing strip 8 is fixedly connected with a peripheral region of the first laminating base platform 1 and with the first vacuum chamber 6 around the first opening, such that the first laminating base platform 1 is stretched to be fixed on the first vacuum chamber 6 at the first opening by the first sealing strip 8; and the second sealing strip 9 is fixedly connected with a peripheral region of the second laminating base platform 3 and with the second vacuum chamber 7 around the second opening, such that the second laminating base platform 3 is stretched to be fixed on the second vacuum chamber 7 at the second opening by the second sealing strip 9.

Based on the same inventive concept, embodiments of the present disclosure further provide a laminating method implemented by the above-mentioned laminating device. The principle of the laminating method to solve problems is similar to that of the above-mentioned laminating device, and therefore, for the implementation of the laminating method provided in the embodiments of the present disclosure, please referring to the implementation of the above-mentioned laminating device, and the descriptions thereof are omitted herein.

Specifically, embodiments of the present disclosure provide a laminating method implemented by the above-mentioned laminating device, including the following steps.

A first laminate layer of a flexible display module is placed on a first laminating base platform with a tension stress, and a second laminate layer of the flexible display module is placed on a second laminating base platform with a tension stress.

A stress applying component controls the first laminating base platform and the second laminating base platform to laminate in a lamination direction, and controls at least one of the first laminating base platform and the second laminating base platform to be deformed in a direction perpendicular to the lamination direction during lamination, such that the first laminate layer, that has been laminated, in an unfolded state is provided with a pre-applied stress, wherein a direction of the pre-applied stress is opposite to a direction of a stress borne by the first laminate layer in a folded state.

Optionally, in the above-mentioned laminating method provided in the embodiments of the present disclosure, the step that the first laminate layer of the flexible display module is placed on the first laminating base platform with the tension stress, and the second laminate layer of the flexible display module is placed on the second laminating base platform with the tension stress may be specifically implemented in the following way.

The first laminate layer of the flexible display module is vacuum-adsorbed on the first laminating base platform with the tension stress, and the second laminate layer of the flexible display module is vacuum-adsorbed on the second laminating base platform with the tension stress, wherein the elastic modulus of the second laminate layer is greater than the elastic modulus of the first laminate layer.

Optionally, in the above-mentioned laminating method provided in the embodiments of the present disclosure, the step that the stress applying component controls the first laminating base platform and the second laminating base platform to laminate in the lamination direction, and controls at least one of the first laminating base platform and the second laminating base platform to be deformed in the direction perpendicular to the lamination direction during lamination may specifically include the following three possible implementation ways.

A first possible implementation way: a first servo motor and a second servo motor respectively drive a first cylinder and a second cylinder to synchronously move in the lamination direction, and the first cylinder and the second cylinder are controlled to move towards each other in the direction perpendicular to the lamination direction, and both moving distances of the first cylinder and the second cylinder in the direction perpendicular to the lamination direction are ½ of a distance from the first laminating base platform to the second laminating base platform, such that the pre-applied stress of the first laminate layer, that has been laminated, in the unfolded state is zero, as shown in FIG. 6.

A second possible implementation way: a first servo motor and a second servo motor respectively drive a first cylinder and a second cylinder to synchronously move in the lamination direction, the first cylinder is controlled to move in the direction perpendicular to the lamination direction until the first laminate layer is in contact with the second laminate layer, and the second cylinder is controlled not to move in the direction perpendicular to the lamination direction, such that the first laminate layer, that has been laminated, in the unfolded state is provided with a pre-tension stress, as shown in FIG. 7.

A third possible implementation way: a first servo motor and a second servo motor respectively drive a first cylinder and a second cylinder to synchronously move in the lamination direction, the first cylinder is controlled not to move in the direction perpendicular to the lamination direction, and the second cylinder is controlled to move in the direction perpendicular to the lamination direction until the first laminate layer is in contact with the second laminate layer, such that the first laminate layer, that has been laminated, in the unfolded state is provided with a pre-compressive stress, as shown in FIG. 8.

Figure 9:
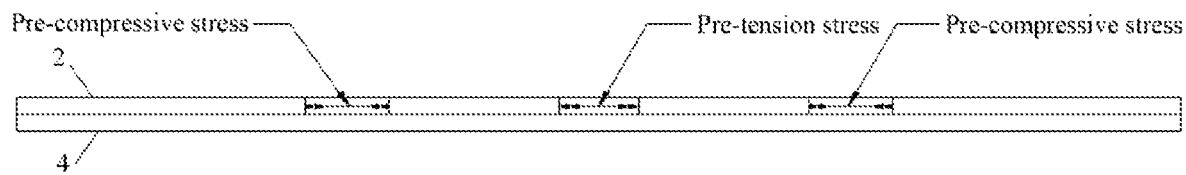
FIG. 9 is a schematic diagram showing an effect achieved after the lamination of a first laminate layer and a second laminate layer is completed by a laminating device provided in an embodiment of the present disclosure.

Specifically, FIG. 9 shows a situation that pre-stresses are correspondingly applied to different parts in the first laminate layer 2 after the first laminate layer 2 and the second laminate layer 4 are laminated by adopting the above-mentioned laminating method.

Accordingly, embodiments of the present disclosure provide a flexible display module, including a plurality of laminate layers, wherein the laminate layers are laminated by the above-mentioned laminating device. The principle of the flexible display module to solve problems is similar to that of the above-mentioned laminating device, and therefore, for the implementation of the flexible display module provided in the embodiments of the present disclosure, please refer to the implementation of the above-mentioned laminating device provided in the embodiments of the present disclosure, and the descriptions thereof are omitted herein.

Figure 10:
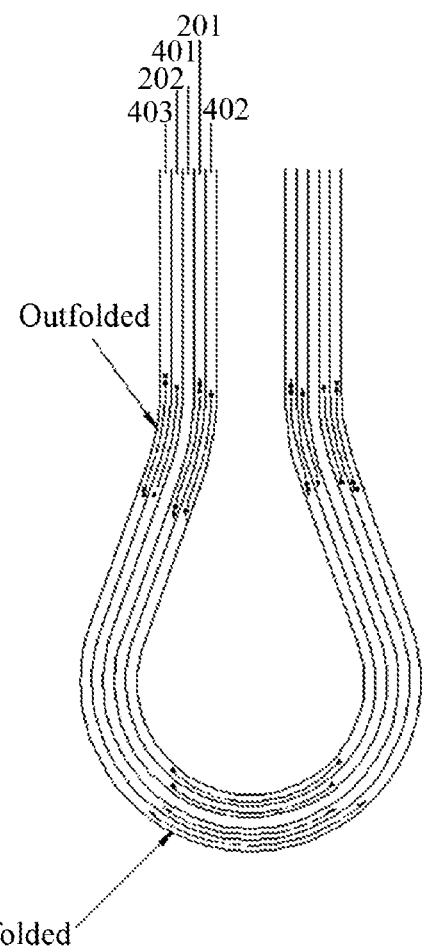
FIG. 10 is a schematic diagram showing that a flexible display module in the related art is stressed in a water drop shape.
Figure 11:
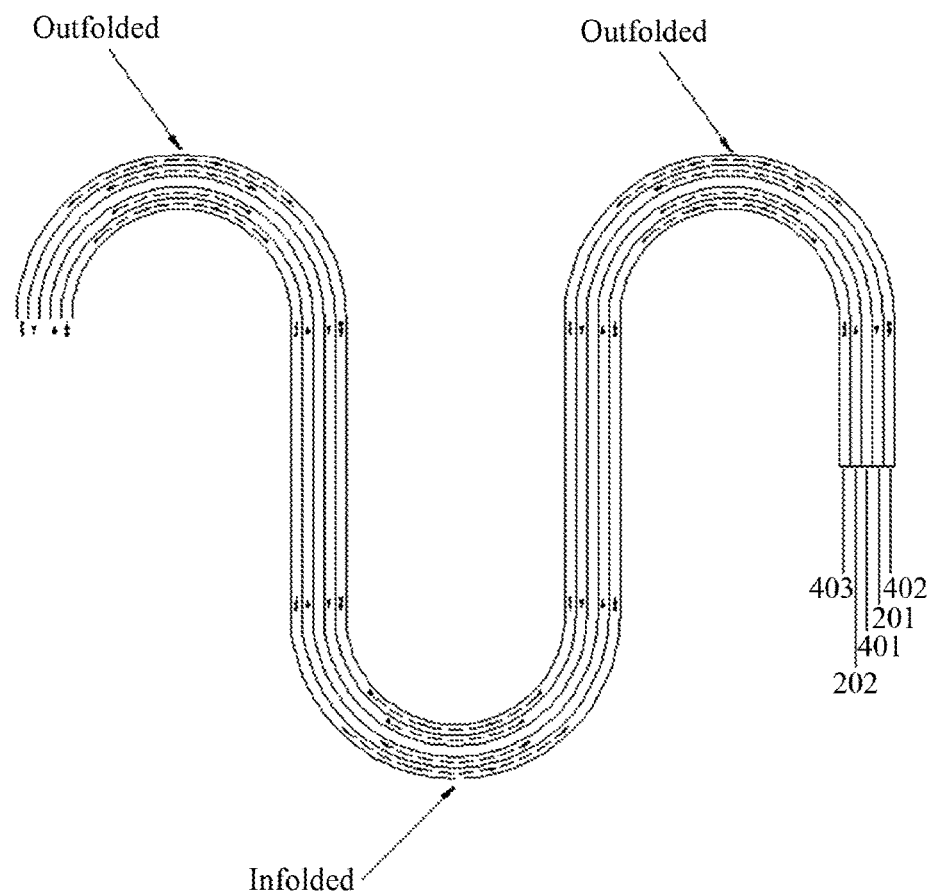
FIG. 11 is a schematic diagram showing that a flexible display module in the related art is stressed in a waveform state.
Figure 12:
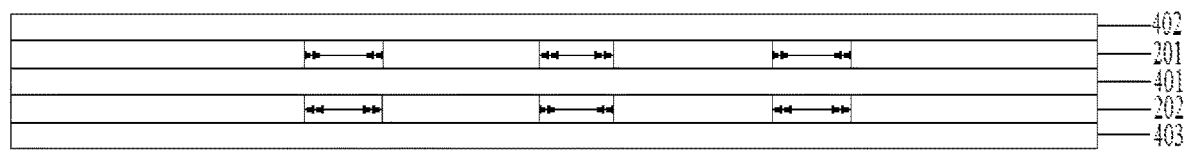
FIG. 12 is a schematic diagram showing an effect achieved after laminate layers of a flexible display module are laminated by a laminating device provided in an embodiment of the present disclosure.

Generally, as shown in FIG. 10 to FIG. 12, the flexible display module includes: a flexible display substrate 401, a supporting plate 402, a protective cover plate 403, a first optical adhesive layer 201 used for adhering the flexible display substrate 401 to the protective cover plate 403, and a second optical adhesive layer 202 used for adhering the flexible display substrate 401 to the supporting plate 402. Specifically, FIG. 10 and FIG. 11 show situations of stresses borne by different areas of the flexible display module in the related art in a folded (that is, infolded and outfolded) state, and FIG. 12 specifically shows situations of pre-applied stresses of different areas of the first optical adhesive layer 201 and the second optical adhesive layer 202 in an unfolded state in the case that the first laminate layer 2 is the first optical adhesive layer 201 or the second optical adhesive layer 202, and the second laminate layer 4 is the flexible display substrate 401 in the present disclosure. It can be seen from FIG. 10 and FIG. 11, the first optical adhesive layer 201 bears a compressive stress in an infolded area and bears a tension stress in outfolded areas at two sides of the infolded area, and the second optical adhesive layer 202 bears a tension stress in an infolded area and bears a compressive stress in outfolded areas at two sides of the infolded area. In FIG. 12, a pre-applied stress opposite to a stress borne in a folded state is applied to the first optical adhesive layer 201 and the second optical adhesive layer 202 in an unfolded state, so that the phenomenon that peeling of an upper laminate layer from a lower laminate layer is caused by long-term action of a folding stress on the optical adhesive layer 201 or the second optical adhesive layer 202 can be effectively avoided.

A main performance of the foldable display product is displaying, while it is inevitable to generate cracks on traces of an inorganic layer inside the flexible display substrate 401 under the long-term action of the folding stress, which may further lead to problems such as corrosive short connection to affect a display function. Therefore, preferably, in the above-mentioned flexible display module provided in the embodiments of the present disclosure, the first laminate layer 2 is the flexible display substrate 401, and the second laminate layer 4 is the supporting plate 402 or the protective cover plate 403, so that the stress on the flexible display substrate is better adjusted to prolong the normal service life of the flexible display substrate. Optionally, the pre-applied stress of the flexible display substrate 401 may be adjusted when it is laminated with the supporting plate 402 or the protective cover plate 403. If the pre-applied stress required by the flexible display substrate 401 is so large that the pre-applied stress cannot be met by adopting a single laminating process, the pre-applied stress can be preliminarily adjusted in a process of laminating with the supporting plate 402 and then adjusted in a process of laminating with the protective cover plate 403.

Figure 13:
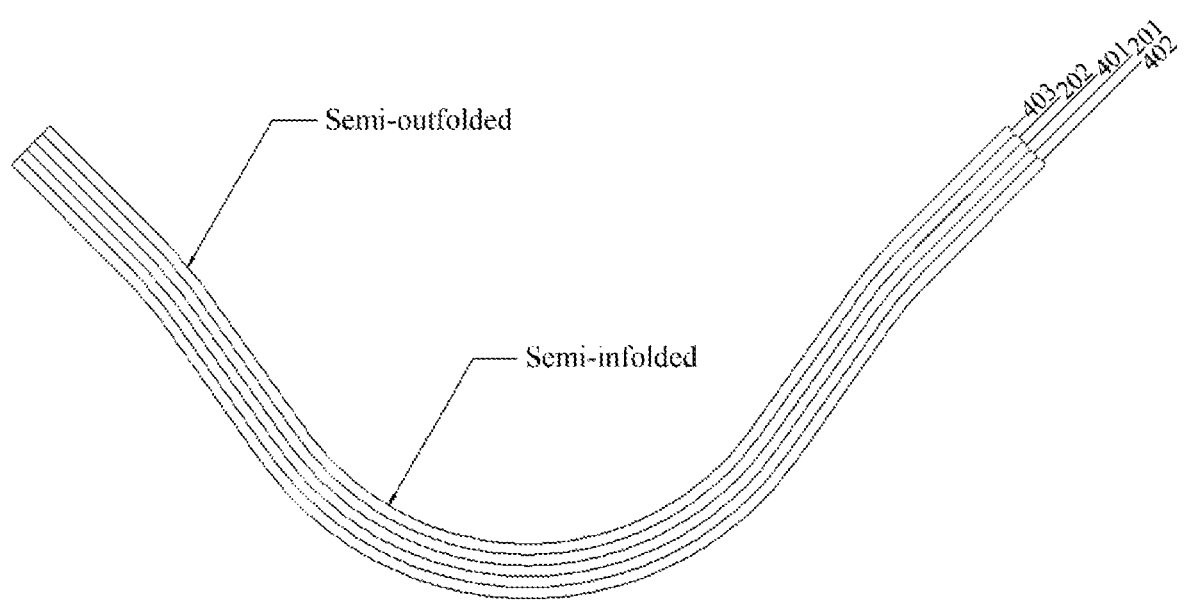
FIG. 13 is a schematic diagram showing that a flexible display module provided in an embodiment of the present disclosure is unstressed in a semi-folded state.
Figure 14:
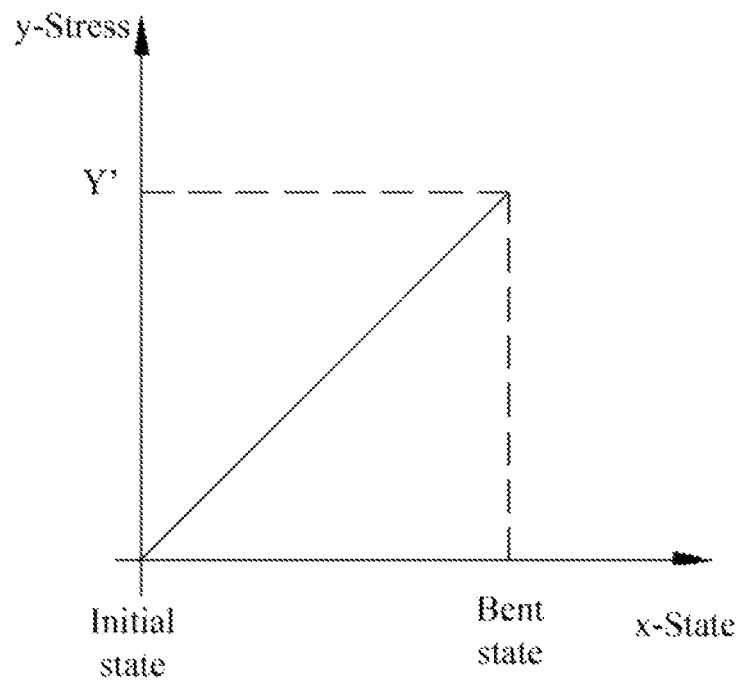
FIG. 14 is a schematic diagram showing that a stress borne by a flexible display module in the related art changes in different states.
Figure 15:
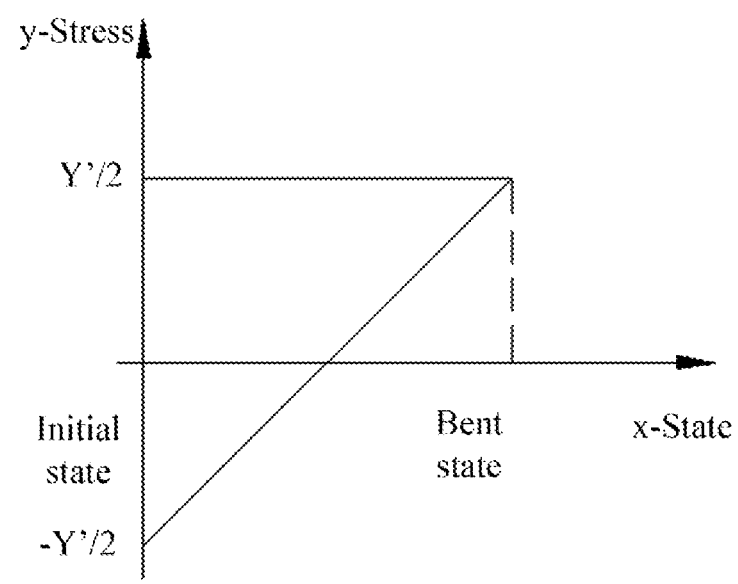
FIG. 15 is a schematic diagram showing that a stress borne by a flexible display module provided in an embodiment of the present disclosure changes in different states.

Optionally, in the above-mentioned flexible display module provided in the embodiments of the present disclosure, a pre-applied stress of each laminate layer in an unfolded state may be set to be half of a stress borne by the laminate layer in a completely folded state, such that a stress borne by the laminate layer in a semi-folded state is zero, a stress borne by the laminate layer in the unfolded state is half of the stress borne by the laminate layer in the completely folded state in the related art, a stress borne by the laminate layer in the completely folded state is reduced by half, and thus, the risk that each laminate layer bears an overlarge stress when in the folded or unfolded state is reduced. Of course, the pre-applied stress may also have other numerical values, and specifically, it is preferable to ensure that the pre-applied stress is not greater than the stress borne by the laminate layer in the completely folded state. Specifically, FIG. 13 shows that an internal stress of each laminate layer in a semi-folded (that is, semi-infolded or semi-outfolded) state is zero. FIG. 14 shows that the foldable display product in the related art bears no internal stress when in an initial state (that is, an unfolded state), but bears a great stress when in a bent state (that is, a completely folded state). FIG. 15 shows that a stress borne by the foldable display product provided in the present disclosure when in an initial state is half of a stress borne in a completely folded state in the related art, a stress borne by the foldable display product in a completely folded state is reduced by half, and a stress borne by the foldable display product in a semi-folded state is zero.

Figure 16:
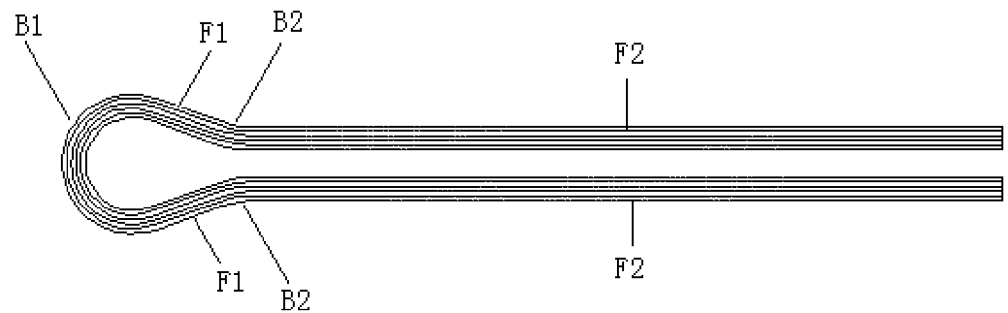
FIG. 16 is a schematic diagram showing a water drop shape of a flexible display module, provided in an embodiment of the present disclosure, in a completely folded state.
Figure 17:
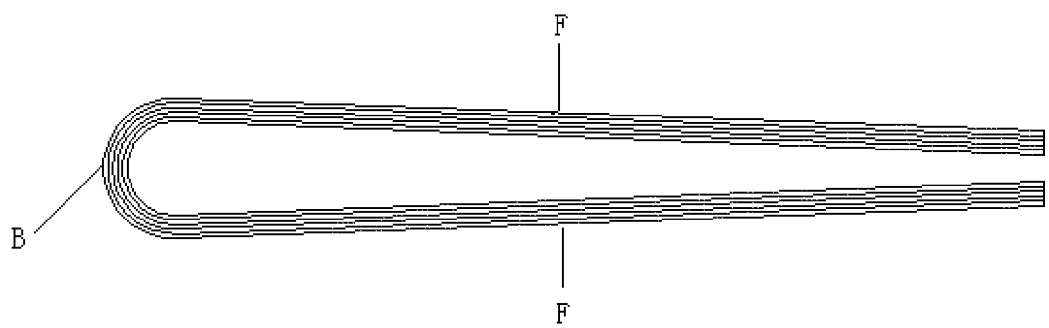
FIG. 17 is a schematic diagram showing a baseball bat form of a flexible display module, provided in an embodiment of the present disclosure, in a completely folded state.
Figure 18:
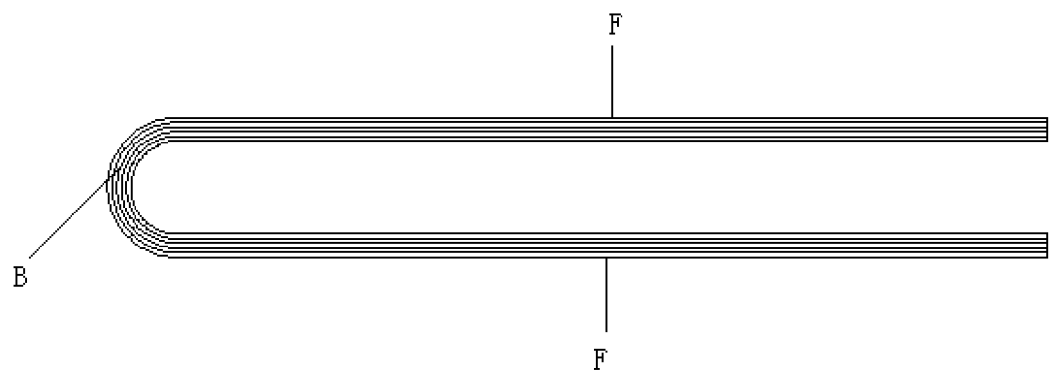
FIG. 18 is a schematic diagram showing a U-shape of a flexible display module, provided in an embodiment of the present disclosure, in a completely folded state.

Optionally, the above-mentioned flexible display module provided in the embodiments of the present disclosure is suitable for various foldable and curly products. Optionally, as shown in FIG. 16, the above-mentioned flexible display module may include: two folding parts, namely a first folding part B1 and second folding parts B2 with opposite bending directions and opposite pre-applied stress directions; or, as shown in FIG. 17 and FIG. 18, the above-mentioned flexible display module may further include a folding part B. Specifically, FIG. 16 further shows that the second folding parts B2 are located at two ends of the first folding part B1, and the flexible display module further includes first flat parts F1 connecting the first folding part B1 with the second folding parts B2, and second flat parts F2 connected with the ends, away from the first flat parts F1, of the second folding parts B2. Optionally, the first folding part B1, the second folding parts B2, the first flat parts F1 and the second flat parts F2 are in a water drop shape when in a completely folded state. Moreover, as shown in FIG. 10, the flexible display module may include: a flexible display substrate 401, a supporting plate 402, a protective cover plate 403, a first optical adhesive layer 201 used for adhering the flexible display substrate 401 to the protective cover plate 403, and a second optical adhesive layer 202 used for adhering the flexible display substrate 401 to the supporting plate 402. Specifically, in the water drop shape, as shown in FIG. 10, in the related art, the first optical adhesive layer 201 and the supporting plate 402 in an area where the first folding part B1 is located bear a compressive stress, the second optical adhesive layer 202 and the protective cover plate 403 bear a tension stress, and the flexible display substrate 401 is unstressed; the first optical adhesive layer 201 and the supporting plate 402 in areas where the second folding parts B2 are located bear a tension stress, the second optical adhesive layer 202 and the protective cover plate 403 bear a compressive stress, and the flexible display substrate 401 is unstressed; and the flexible display substrate 401, the first optical adhesive layer 201, the supporting plate 402, the second optical adhesive layer 202 and the protective cover plate 403 in areas where the first flat parts F1 and the second flat parts F2 are located are unstressed. During lamination in the present disclosure, pre-tension stresses of the first optical adhesive layer 201 and the supporting plate 402 in the area where the first folding part B1 is located are equal to ½ of compressive stresses borne by them in the water drop shape, and pre-compressive stresses of the second optical adhesive layer 202 and the protective cover plate 403 are equal to ½ of tension stresses borne by them in the water drop shape. Pre-compressive stresses of the first optical adhesive layer 201 and the supporting plate 402 in the areas where the second folding parts B2 are located are equal to ½ of tension stresses borne by them in the water drop shape, and pre-tension stresses of the second optical adhesive layer 202 and the protective cover plate 403 are equal to ½ of compressive stresses borne by them in the water drop shape. In this way, when the flexible display module provided in the present disclosure is in the water drop shape, stresses borne by each film layer corresponding to the first folding part B1 and the second folding parts B2 are both reduced by half. FIG. 17 further shows flat parts F at two ends of the folding part B, and in a completely folded state, a distance between the two flat parts F is gradually reduced in a direction away from the folding part B to form a baseball bat shape. FIG. 18 further shows flat parts F located at two ends of the folding part B, and in a completely folded state, a distance between the two flat parts F is kept unchanged in a direction away from the folding part B to form a U-shape.

Based on the same inventive concept, an embodiment of the present disclosure further provides a display device, including the above-mentioned flexible display module provided in the embodiments of the present disclosure. The display device may be any product or component with a display function, such as a mobile phone, a tablet computer, a television, a display, a notebook computer, a digital photo frame, a navigator, a smart watch, a fitness wristband and a personal digital assistant. Other essential components of the display device should be known to those of ordinary skill in the art, and they will not be repeated herein and should not be taken as a limitation to the present disclosure. In addition, the principle of the display device to solve problems is similar to that of the above-mentioned flexible display module, and therefore, for the implementation of the display device, please referring to the implementation of the above-mentioned flexible display module, the descriptions thereof are omitted herein.

Obviously, those skilled in the art can make various modifications and variations to the present disclosure without departing from the spirit and scope of the present disclosure. In this way, if these modifications and variations of the present disclosure fall within the scope of the claims of the present disclosure and their equivalent technologies, the present disclosure is also intended to include these modifications and variations.

What is claimed is:

1. A laminating device, configured to laminate layers of a flexible display module, wherein the laminating device comprises:
   a first laminating base platform, provided with a tension stress and configured to bear a first laminate layer of the flexible display module;
   a second laminating base platform, opposite to the first laminating base platform, wherein the second laminating base platform is provided with a tension stress, and a surface, facing the first laminating base platform, of the second laminating base platform is configured to bear a second laminate layer of the flexible display module; and
   a stress applying component, configured to control the first laminating base platform and the second laminating base platform to laminate in a lamination direction, and control at least one of the first laminating base platform and the second laminating base platform to be deformed in a direction perpendicular to the lamination direction during lamination, such that the first laminate layer, that has been laminated, in an unfolded state is provided with a pre-applied stress, wherein a direction of the pre-applied stress is opposite to a direction of a stress borne by the first laminate layer in a folded state.

2. The laminating device according to claim 1, wherein an elastic modulus of the second laminate layer is greater than an elastic modulus of the first laminate layer.

3. The laminating device according to claim 1, wherein the first laminating base platform and the second laminating base platform are made of a non-woven fabric.

4. The laminating device according to claim 1, wherein the stress applying component comprises: a first roller, a second roller, a first cylinder, a second cylinder, a first servo motor, a second servo motor, a first driving track and a second driving track, wherein
the first roller is in contact with a surface, away from the first laminate layer, of the first laminating base platform, and the first roller is fixed to the first cylinder;
the first servo motor is configured to drive the first cylinder to move on the first driving track in the lamination direction, and provide power, in the direction perpendicular to the lamination direction, for the first cylinder;
the second roller is in contact with a surface, away from the second laminate layer, of the second laminating base platform, and the second roller is fixed to the second cylinder; and
the second servo motor is configured to drive the second cylinder to synchronously move with the first cylinder on the second driving track in the lamination direction, and provide power, in the direction perpendicular to the lamination direction, for the second cylinder.

5. The laminating device according to claim 4, wherein the first cylinder controls a stroke of the first roller in the direction perpendicular to the lamination direction to be equal to ½ of a distance from the first laminating base platform to the second laminating base platform; and
the second cylinder controls a stroke of the second roller in the direction perpendicular to the lamination direction to be equal to ½ of the distance from the first laminating base platform to the second laminating base platform.

6. The laminating device according to claim 4, wherein the first cylinder controls a stroke of the first roller in the direction perpendicular to the lamination direction to be zero; and
the second cylinder controls a stroke of the second roller in the direction perpendicular to the lamination direction to be equal to a distance from the first laminating base platform to the second laminating base platform.

7. The laminating device according to claim 4, wherein the first cylinder controls a stroke of the first roller in the direction perpendicular to the lamination direction to be equal to a distance from the first laminating base platform to the second laminating base platform; and
the second cylinder controls a stroke of the second roller in the direction perpendicular to the lamination direction to be zero.

8. The laminating device according to claim 4, further comprising: a first vacuum chamber and a second vacuum chamber which are oppositely disposed, wherein
the first laminating base platform and the first driving track are fixed inside the first vacuum chamber, and a side, facing the second vacuum chamber, of the first vacuum chamber is provided with a first opening to expose a surface, bearing the first laminate layer, of the first laminating base platform; and
the second laminating base platform and the second driving track are fixed inside the second vacuum chamber, and a side, facing the first vacuum chamber, of the second vacuum chamber is provided with a second opening to expose a surface, bearing the second laminate layer, of the second laminating base platform.

9. The laminating device according to claim 8, further comprising: a first sealing strip and a second sealing strip, wherein the first sealing strip is fixedly connected with a peripheral region of the first laminating base platform and with the first vacuum chamber around the first opening; and
the second sealing strip is fixedly connected with a peripheral region of the second laminating base platform and with the second vacuum chamber around the second opening.

10. A laminating method, implemented by the laminating device according to claim 1, comprising:
placing a first laminate layer of a flexible display module on the first laminating base platform with a tension stress, and placing a second laminate layer of the flexible display module on the second laminating base platform with a tension stress; and
controlling, by the stress applying component, the first laminating base platform and the second laminating base platform to laminate in a lamination direction, and controlling, by the stress applying component, at least one of the first laminating base platform and the second laminating base platform to be deformed in a direction perpendicular to the lamination direction during lamination, such that the first laminate layer, that has been laminated, in an unfolded state is provided with a pre-applied stress, wherein a direction of the pre-applied stress is opposite to a direction of a stress borne by the first laminate layer in a folded state.

11. The laminating method according to claim 10, wherein the placing the first laminate layer of the flexible display module on the first laminating base platform with a tension stress, and the placing the second laminate layer of the flexible display module on the second laminating base platform with the tension stress comprises:
vacuum-adsorbing the first laminate layer of the flexible display module on the first laminating base platform with the tension stress, and vacuum-adsorbing the second laminate layer of the flexible display module on the second laminating base platform with the tension stress, wherein an elastic modulus of the second laminate layer is greater than an elastic modulus of the first laminate layer.

12. The laminating method according to claim 10, wherein the controlling, by the stress applying component, the first laminating base platform and the second laminating base platform to laminate in the lamination direction, and the controlling, by the stress applying component, at least one of the first laminating base platform and the second laminating base platform to be deformed in the direction perpendicular to the lamination direction during lamination comprises:
driving, by a first servo motor and a second servo motor, a first cylinder and a second cylinder to synchronously move in the lamination direction, respectively, and controlling the first cylinder and the second cylinder to move towards each other in the direction perpendicular to the lamination direction for ½ of a distance from the first laminating base platform to the second laminating base platform, respectively, such that the pre-applied stress of the first laminate layer, that has been laminated, in the unfolded state is zero.

13. The laminating method according to claim 10, wherein the controlling, by the stress applying component, the first laminating base platform and the second laminating base platform to laminate in the lamination direction, and the controlling, by the stress applying component, at least one of the first laminating base platform and the second laminating base platform to be deformed in the direction perpendicular to the lamination direction during lamination comprises:

driving, by a first servo motor and a second servo motor, a first cylinder and a second cylinder to synchronously move in the lamination direction, respectively, controlling the first cylinder to move in the direction perpendicular to the lamination direction until the first laminate layer is in contact with the second laminate layer, and controlling the second cylinder not to move in the direction perpendicular to the lamination direction, such that the first laminate layer, that has been laminated, in the unfolded state is provided with a pre-tension stress.

14. The laminating method according to claim 10, wherein the controlling, by the stress applying component, the first laminating base platform and the second laminating base platform to laminate in the lamination direction, and the controlling, by the stress applying component, at least one of the first laminating base platform and the second laminating base platform to be deformed in the direction perpendicular to the lamination direction during lamination comprises:

driving, by a first servo motor and a second servo motor, a first cylinder and a second cylinder to synchronously move in the lamination direction, respectively, controlling the first cylinder not to move in the direction perpendicular to the lamination direction, and controlling the second cylinder to move in the direction perpendicular to the lamination direction until the first laminate layer is in contact with the second laminate layer, such that the first laminate layer, that has been laminated, in the unfolded state is provided with a pre-compressive stress.

* * * * *